US009017831B2

(12) United States Patent
Nakada et al.

(10) Patent No.: US 9,017,831 B2
(45) Date of Patent: Apr. 28, 2015

(54) THIN-FILM MAGNETIC OSCILLATION ELEMENT

(71) Applicant: TDK Corporation, Tokyo (JP)

(72) Inventors: Katsuyuki Nakada, Tokyo (JP); Takahiro Suwa, Tokyo (JP); Kuniyasu Ito, Tokyo (JP); Yuji Kakinuma, Tokyo (JP); Masato Takahashi, Tokyo (JP)

(73) Assignee: TDK Corporation, Tokyo (JP)

(*) Notice: Subject to any disclaimer, the term of this patent is extended or adjusted under 35 U.S.C. 154(b) by 81 days.

(21) Appl. No.: 13/779,048

(22) Filed: Feb. 27, 2013

(65) Prior Publication Data

US 2013/0222092 A1 Aug. 29, 2013

(30) Foreign Application Priority Data

Feb. 29, 2012 (JP) ................................. 2012-044093

(51) Int. Cl.
*G11C 11/16* (2006.01)
*H01F 1/00* (2006.01)
*G01R 33/09* (2006.01)
*H01F 10/32* (2006.01)
*G11B 5/39* (2006.01)

(52) U.S. Cl.
CPC .............. *H01F 1/0036* (2013.01); *G11C 11/16* (2013.01); *G01R 33/091* (2013.01); *G11B 5/3903* (2013.01); *G01R 33/093* (2013.01); *H01F 10/3268* (2013.01)

(58) Field of Classification Search
None
See application file for complete search history.

(56) References Cited

U.S. PATENT DOCUMENTS

| 8,208,219 | B2* | 6/2012 | Zhang et al. | 360/125.03 |
| 8,427,246 | B2* | 4/2013 | Lee et al. | 331/94.1 |
| 8,598,957 | B2* | 12/2013 | Lee et al. | 331/46 |
| 2006/0132990 | A1* | 6/2006 | Morise et al. | 360/324.12 |
| 2008/0304176 | A1* | 12/2008 | Takagishi et al. | 360/86 |
| 2013/0077391 | A1* | 3/2013 | Luo et al. | 365/158 |

FOREIGN PATENT DOCUMENTS

| JP | A-2003-229612 | 8/2003 |
| JP | A-2008-84879 | 4/2008 |

OTHER PUBLICATIONS

Yoda, "Spin-Transfer Torque writing Magneto-Resistive Random Access Memory with Perpendicular Magnetic Tunnel Junctions," *Magnetics Japan*, 2010, pp. 184-190, vol. 5, No. 4, published by the Magnetics Society of Japan (w/abstract).

Matsumoto et al., "Spin-torque-induced switching and precession in fully epitaxial Fe/MgO/Fe magnetic tunnel junctions," *Physical Review B*, 2009, pp. 174405-1-174405-8, vol. 80, No. 174405, published by The American Physical Society.

* cited by examiner

*Primary Examiner* — Kevin Bernatz
(74) *Attorney, Agent, or Firm* — Oliff PLC

(57) ABSTRACT

A thin-film magnetic oscillation element includes a pinned magnetic layer, a free magnetic layer, a nonmagnetic spacer layer provided between the pinned magnetic layer and the free magnetic layer, and a pair of electrodes, in which the easy axis of magnetization of the pinned magnetic layer lies in an in-plane direction of the plane of the pinned magnetic layer, and the easy axis of magnetization of the free magnetic layer lies in a direction normal to the plane of the free magnetic layer. Preferably, the relationship between the saturation magnetization Ms and the magnetic anisotropy field Ha of the free magnetic layer satisfies $1.257 Ms < Ha < 12.57 Ms$. More preferably, the free magnetic layer is composed of an alloy or a stacked film containing at least one element selected from Co, Ni, Fe, and B.

3 Claims, 6 Drawing Sheets

THIN-FILM MAGNETIC OSCILLATION ELEMENT

BACKGROUND OF THE INVENTION

1. Field of the Invention

The present invention relates to a thin-film magnetic oscillation element applied to, for example, wireless signal transmission, an element having a new function for communications.

2. Description of the Related Art

In magnetoresistive elements (MR elements), such as giant magnetoresistive (GMR) elements and tunneling magnetoresistive (TMR) elements, spin-polarized electrons flow when a current passes, and the magnetization direction of a free magnetic layer (i.e., the orientation of electron spin) varies depending on the number of spin-polarized electrons accumulated in the free magnetic layer. When an attempt is made to change the magnetization direction of a free magnetic layer arranged in a constant magnetic field, a torque acts on the electron spin so as to restore the electron spin to a stable orientation restricted by the magnetic field. When the electron spin is perturbed with a specific force, oscillation referred to as spin precession occurs.

In the case where spin precession is generated by spin-polarized electrons, a reduction in threshold current density required for oscillation (hereinafter, referred to as an "oscillation threshold current density") has been one of the issues. Specifically, the oscillation threshold current density is required to be lower than $1.0 \times 10^7$ A/cm$^2$.

To reduce the oscillation threshold current density, it is reported that a perpendicular magnetic film is used (Magnetics Japan Vol. 5, No. 4, 2010, pp. 184-190). According to this document, in the perpendicular magnetic film, a spin-transfer torque threshold current can be reduced by the demagnetizing field term, compared with an in-plane magnetic film. Thus, a threshold current of spin-torque oscillation, which is a precursor phenomenon of magnetization reversal due to a spin-transfer torque, should be reduced. In fact, when a magnetoresistive element in which a pinned magnetic layer and a free magnetic layer are perpendicular magnetic layers is used as a thin-film magnetic oscillation element, it is confirmed that the magnetoresistive element has an oscillation threshold current density of $5.0 \times 10^6$ A/cm$^2$ (see Japanese Unexamined Patent Application Publication No. 2008-84879).

To achieve the spin-torque oscillation, the initial magnetic orientation of each of a pinned magnetic layer and a free magnetic layer is important. For example, with respect to the initial magnetization state, oscillation occurs easily when the magnetization directions of the layers are antiparallel rather than parallel (PHYSICAL REVIEW B 80, 174405(2009)).

As an example in which the initial magnetization directions of a pinned magnetic layer and a free magnetic layer are specified, a magnetoresistive sensor is reported (Japanese Unexamined Patent Application Publication No. 2003-229612), the magnetoresistive sensor including a magnetoresistive film which has a fixed magnetic layer (a pinned magnetic layer in the present invention) and which has a free magnetic layer with a nonmagnetic intermediate layer provided therebetween, the magnetization of the fixed magnetic layer being fixed in the plane of the layer, and the easy axis of magnetization of the free magnetic layer being oriented substantially perpendicularly to the plane of the layer; and a pair of electrode layers configured to allow a sense current to flow in a direction perpendicular to the plane of the magnetoresistive film.

SUMMARY OF THE INVENTION

To increase the withstand voltage of an element with the miniaturization of a thin-film magnetic oscillation element, the oscillation threshold current density is required to be further reduced. In Japanese Unexamined Patent Application Publication No. 2008-84879, the magnetization direction of the free magnetic layer is parallel to the magnetization direction of the pinned magnetic layer. According to PHYSICAL REVIEW B 80, 174405(2009), spin-torque oscillation does not easily occur in this condition. Thus, the layer structure described in Japanese Unexamined Patent Application Publication No. 2008-84879 is not an optimal structure as a thin-film magnetic oscillation element.

The layer structure described in Japanese Unexamined Patent Application Publication No. 2003-229612 is a layer structure with a proven track record as, for example, a magnetoresistive sensor configured to read an information signal recorded on a magnetic recording medium. In the case where the layer structure is used as a thin-film magnetic oscillation element in which spin precession is caused by spin-polarized electrons, however, it is unclear whether or not the effect of reducing the oscillation threshold current density can be provided.

In the case of a memory device, such as MRAM, it is important to stably maintain the magnetization directions of a pinned magnetic layer and a free magnetic layer in a state where no external magnetic field is applied. To achieve this, there have been advances in the development of layer structures including pinned magnetic layers and free magnetic layers. In line with this policy, the development of a thin-film magnetic oscillation element has been made on the idea that a layer structure optimized for a memory device will be most suitable as a thin-film magnetic oscillation element. In the case of a thin-film magnetic oscillation element, however, it is important to continue to cause the precession of the magnetization of a free magnetic layer with an external magnetic field applied. Thus, a layer structure configured to stably maintain the magnetization directions of a pinned magnetic layer and a free magnetic layer in a state where no external magnetic field is present is not necessarily required, unlike the memory device. If anything, the free magnetic layer may have magnetization stability to the extent that the magnetization direction of the free magnetic layer is not disordered. Furthermore, the saturation magnetization Ms and the magnetic anisotropy field Ha of the free magnetic layer do not necessarily satisfy the optimal conditions for the memory device. That is, even in the case of a layer structure that is not an optimal structure to stably maintain the magnetization directions of a pinned magnetic layer and a free magnetic layer in a state where no external magnetic field is present, when the layer structure is used for a thin-film magnetic oscillation element, this may lead to a reduction in oscillation threshold current density. However, the verification is hardly performed.

The present invention has been accomplished to overcome these problems. It is an object of the present invention to provide a thin-film magnetic oscillation element suitable for a high-frequency device.

To achieve the foregoing object, a thin-film magnetic oscillation element according to aspects of the present invention includes a pinned magnetic layer, a free magnetic layer, a nonmagnetic spacer layer provided between the pinned magnetic layer and the free magnetic layer, and a pair of electrodes, in which the easy axis of magnetization of the pinned magnetic layer lies in an in-plane direction of the plane of the pinned magnetic layer, and the easy axis of magnetization of the free magnetic layer lies in a direction normal to the plane of the free magnetic layer.

In the thin-film magnetic oscillation element to achieve the foregoing object, the relationship between the saturation magnetization Ms and the magnetic anisotropy field Ha of the free magnetic layer may satisfy 1.257 Ms<Ha<12.57 Ms.

In the thin-film magnetic oscillation element to achieve the foregoing object, the free magnetic layer may be composed of an alloy or a stacked film containing at least one element selected from Co, Ni, Fe, and B.

In the thin-film magnetic oscillation element to achieve the foregoing object, the free magnetic layer may have a plurality of stacked structures each selected from [CoFe/Ni], [Co/NiFe], and [CoFe/NiFe].

In the thin-film magnetic oscillation element to achieve the foregoing object, the number of the stacked structures may be 5 or more and 27 or less.

In the thin-film magnetic oscillation element to achieve the foregoing object, the Fe content of the CoFe may be 4 at % or more and 55 at % or less with respect to the total of Co and Fe.

In the thin-film magnetic oscillation element to achieve the foregoing object, the Fe content of the NiFe may be 1.5 at % or more and 10 at % or less with respect to the total of Ni and Fe.

The thin-film magnetic oscillation element according to aspects of the present invention has a reduced oscillation threshold current density, compared with elements in the related art.

DESCRIPTION OF THE PREFERRED EMBODIMENTS

Embodiments of the present invention will be described in detail below with reference to the attached drawings.

Figure 1:
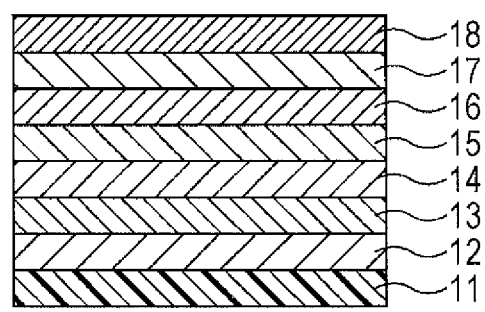
FIG. 1 is a cross-sectional view of a bottom-type spin valve structure according to a first embodiment of the present invention at a stage where a capping layer is formed.

As illustrated in FIG. 1, a silicon substrate having a smooth surface is prepared as a substrate 11. The silicon substrate has an outside diameter of 150 mm and a thickness of about 2 mm and is commercially available.

Next, a lower electrode layer 12, a buffer layer 13, an antiferromagnetic layer 14, a pinned magnetic layer 15, a nonmagnetic spacer layer 16, a free magnetic layer 17, and a capping layer 18 are formed. Each of the layers is formed with, for example, a sputter deposition system. As the sputter deposition system, it is preferred to use a system that includes two physical vapor deposition (PVD) chambers each equipped with eight targets; and an oxidation chamber. For example, C-7100, manufactured by Anelva Corp., may be used. Co-sputtering can be preferably performed in at least one of the plural PVD chambers. The sputter deposition is performed by sputtering a target composed of a metal or an alloy with, for example, argon sputtering gas to form a film on the substrate in ultrahigh vacuum. At this time, the gas flow rate is preferably in the range of 30 sccm to 300 sccm. The applied power between the substrate and the target is preferably in the range of 50 W to 500 W. The degree of vacuum is preferably $5.0 \times 10^{-6}$ Pa or less.

Each of the layers will be described below.

The lower electrode layer 12 is paired with an upper electrode layer 20 described below. Specifically, the lower electrode layer 12 serves as one of the pair of electrodes configured to allow a current to flow through an element in a direction intersecting with the plane of each layer included in the element, for example, in a direction (stacking direction) perpendicular to the plane of each layer included in the element. Examples of the lower electrode layer 12 and the upper electrode layer 20 that may be used include stacks of Ta and Cu, stacks of Ta and Au, stacks of Ta and AuCu, and stacks of Ta and Ru. Each of the lower electrode layer 12 and the upper electrode layer 20 has a thickness of about 0.05 μm to about 5 μm.

The buffer layer 13 is provided to prevent the crystallinity of the lower electrode layer 12 from affecting the antiferromagnetic layer 14 and to control the orientation and the grain size of the antiferromagnetic layer 14. In particular, the buffer layer 13 is provided to achieve satisfactory exchange coupling between the antiferromagnetic layer 14 and the pinned magnetic layer 15. Examples of the buffer layer 13 that may be used include stacks of Ta and NiCr; and stacks of Ta and Ru. The buffer layer 13 has a thickness of, for example, about 2 nm to about 6 nm.

The antiferromagnetic layer 14 is provided to impart uniaxial magnetic anisotropy to the pinned magnetic layer 15 by exchange coupling with the pinned magnetic layer 15.

The antiferromagnetic layer 14 is composed of, for example, an antiferromagnetic material containing Mn and at least one element selected from the group consisting of Pt, Ru, Rh, Pd, Ni, Cu, Ir, Cr, and Fe. The Mn content is preferably in the range of 35 at % to 95 at %. Antiferromagnetic materials include non-heat-induced antiferromagnetic materials that exhibit antiferromagnetism without heat treatment and induce exchange coupling with ferromagnetic materials; and heat-induced antiferromagnetic materials that exhibit antiferromagnetism by heat treatment. In the present invention, any antiferromagnetic material may be used. Examples of non-heat-induced antiferromagnetic materials include RuRhMn, FeMn, and IrMn. Examples of heat-induced antiferromagnetic materials include PtMn, NiMn, and PtRhMn. Note that in non-heat-induced antiferromagnetic materials, heat treatment is usually performed to align the direction of exchange coupling. The antiferromagnetic layer 14 has a thickness of about 4 nm to about 30 nm.

Instead of the antiferromagnetic layer, a hard magnetic layer composed of a hard magnetic material, such as CoPt, may be provided as a layer to pin the magnetization direction of the pinned magnetic layer 15.

FIG. 1 illustrates the embodiment in which the antiferromagnetic layer 14 is formed on the side of the bottom (on the side of the lower electrode layer 12). Alternatively, an embodiment in which the antiferromagnetic layer 14 is formed on the side of the top (on the side of the capping layer 18) and in which the positions of the free magnetic layer 17 and the pinned magnetic layer 15 are interchanged may be used.

The pinned magnetic layer 15 is formed on the antiferromagnetic layer 14 that provides a pinning effect. In a preferred embodiment, the pinned magnetic layer 15 has a structure in which an outer layer, a nonmagnetic intermediate layer, and an inner layer are sequentially stacked from the side of the antiferromagnetic layer 14, i.e., the pinned magnetic layer 15 is constituted by a synthetic pinned layer.

Each of the outer layer and the inner layer includes a ferromagnetic layer composed of a ferromagnetic material containing, for example, Co and Fe. The outer layer and the inner layer are antiferromagnetically coupled with each other, and the magnetization of the outer layer and the magnetization of the inner layer are pinned in such a manner that the magnetization directions of the outer layer and the inner layer are opposite each other.

For example, preferably, each of the outer layer and the inner layer preferably is composed of a CoFe alloy or has a stacked structure composed of CoFe alloys with different compositions or a stacked structure of a CoFeB alloy and a CoFe alloy. The outer layer preferably has a thickness of about 1 nm to about 7 nm. The inner layer preferably has a thickness of about 2 nm to about 10 nm. The inner layer may contain a Heusler alloy.

The nonmagnetic intermediate layer is composed of, for example, a nonmagnetic material containing at least one selected from the group consisting of Ru, Rh, Ir, Re, Cr, Zr, and Cu. The nonmagnetic intermediate layer has a thickness of, for example, about 0.35 nm to about 1.0 nm. The nonmagnetic intermediate layer is provided in such a manner that the magnetization of the inner layer and the magnetization of the outer layer are pinned in directions opposite to each other. The phrase "in directions opposite to each other" should not be narrowly construed to indicate only that the two magnetization directions are 180° opposite each other and should be broadly construed to include the case where the two magnetization directions lie at an angle of (180°−20°) to (180°+20°) to each other.

The nonmagnetic spacer layer 16 is formed to provide the magnetoresistive effect by the interaction between the magnetization of the pinned magnetic layer 15 and the magnetization of the free magnetic layer 17.

Examples of a material for the nonmagnetic spacer layer 16 include insulating materials, semiconductor materials, and conductive materials.

In the case where the nonmagnetic spacer layer 16 is composed of an insulating material, examples of the insulating material include alumina and magnesium oxide (MgO). With respect to MgO, single-crystal $MgO_x(001)$ is preferred. Adjustment is preferably performed so as to induce a coherent tunnel effect between the nonmagnetic spacer layer 16 and the free magnetic layer 17, thereby resulting in a high rate of change in magnetoresistance. The insulating material preferably has a thickness of about 0.5 nm to about 2.0 nm.

In the case where the nonmagnetic spacer layer 16 is composed of a semiconductor material, the nonmagnetic spacer layer 16 preferably has a structure in which a first nonmagnetic metal layer, a semiconductor oxide layer, and a second nonmagnetic metal layer are sequentially stacked from the side of the pinned magnetic layer 15. Examples of a material for the first nonmagnetic metal layer include Cu and Zn. The first nonmagnetic metal layer preferably has a thickness of about 0.1 nm to about 1.2 nm. Examples of a material for the semiconductor oxide layer include zinc oxide (ZnO), indium oxide ($In_2O_3$), tin oxide ($SnO_2$), indium tin oxide (ITO), and gallium oxide ($GaO_x$ or $Ga_2O_x$). The semiconductor oxide layer preferably has a thickness of about 1.0 nm to about 4.0 nm. Examples of a material for the second nonmagnetic metal layer include Zn, alloys of Zn and Ga, stacks of Zn and GaO, Cu, and alloys of Cu and Ga. The second nonmagnetic metal layer preferably has a thickness of about 0.1 nm to about 1.2 nm.

In the case where the nonmagnetic spacer layer 16 is composed of a conductive material, examples of the conductive material include Cu and Ag. The conductive material preferably has a thickness of about 1 nm to about 4 nm.

The free magnetic layer 17 is a layer whose magnetization direction is changed by an external magnetic field or spin-polarized electrons.

In the free magnetic layer 17, the easy axis of magnetization lies in a direction normal to the plane of the layer. Examples of a material for the free magnetic layer 17 include Co, Co/nonmagnetic layer stacks, CoCr-based alloys, Co multilayers, CoCrPt-based alloys, FePt-based alloys, rare-earth-containing SmCo-based alloys, TbFeCo alloys, and Heusler alloys.

In the free magnetic layer 17, the relationship between the saturation magnetization Ms and the magnetic anisotropy field Ha preferably satisfies $1.257 Ms < Ha < 12.57 Ms$.

The free magnetic layer 17 is preferably composed of an alloy or a multilayer film containing at least one element selected from Co, Ni, Fe, and B. In particular, the free magnetic layer 17 preferably has a plurality of stacked structures each selected from [CoFe/Ni], [Co/NiFe], and [CoFe/NiFe].

In the case where the free magnetic layer 17 has a structure including a plurality of stacked structures each selected from [CoFe/Ni], [Co/NiFe], and [CoFe/NiFe], the number of the stacked structures is preferably 5 or more and 27 or less. The Fe content of the CoFe is preferably 4 at % or more and 55 at % or less with respect to the total of Co and Fe. The Fe content of the NiFe is preferably 1.5 at % or more and 10 at % or less with respect to the total of Ni and Fe.

A high-spin-polarized material may be provided between the stacked structure of the free magnetic layer 17 and the nonmagnetic spacer layer 16, thereby resulting in a high rate of change in magnetoresistance.

Examples of the high-spin-polarized material include CoFe alloys and CoFeB alloys. Each of the CoFe alloys and the CoFeB alloys preferably has a thickness of 0.2 nm or more and 1 nm or less.

In addition, magnetic anisotropy may be induced by applying a constant magnetic field in a direction perpendicular to the plane of the layer at the time of the formation of the free magnetic layer 17.

The capping layer 18 is provided to protect the nonmagnetic spacer layer 16 from oxidation, etching, and so forth. For example, the capping layer 18 is preferably composed of Ru, Ta, or a multilayer film containing Ru and Ta. The capping layer 18 preferably has a thickness of about 2 nm to about 10 nm.

After the formation of the capping layer 18, in order to pin the magnetization of the pinned magnetic layer 15, annealing is performed. The annealing is preferably performed at a degree of vacuum of $1.0 \times 10^{-3}$ Pa or less and a temperature of 250° C. to 300° C. for 1 hour to 5 hours in an applied magnetic field of 3 kOe to 10 kOe.

Figure 2:
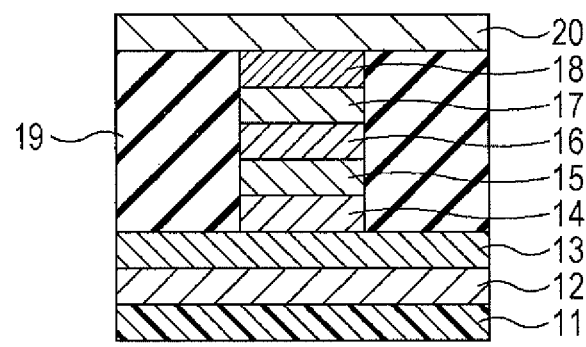
FIG. 2 is a cross-sectional view of the bottom-type spin valve structure according to the first embodiment of the present invention at a stage where an upper electrode layer is formed.

After the annealing, the element is patterned by well-known photoresist patterning and ion-beam etching into a shape, for example, a circle, an ellipse, or a rectangle when viewed in plan. The patterned element preferably has a size of 100 nm or less. After the patterning, as illustrated in FIG. 2, an oxide, such as alumina, is deposited as an insulating layer 19 so as to be flush with the capping layer 18. A resist and an insulating film deposited on the resist are removed with a solvent capable of dissolving the resist. Then the upper electrode layer 20 is formed.

While the embodiments of the present invention will be more specifically described by examples, the present invention is not limited to these examples.

EXAMPLES

Example 1

To evaluate the magnetic properties of the free magnetic layer 17 with a vibrating sample magnetometer (VSM), a test stacked film including the buffer layer 13, the nonmagnetic spacer layer 16, the free magnetic layer 17, and the capping layer 18 formed, in that order, on the substrate 11 by sputtering was produced. In this example, the substrate 11 was formed of a silicon substrate. The buffer layer 13 was formed of Ta (2 nm)/Ru (2 nm). The nonmagnetic spacer layer 16 was formed of MgO (1 nm). The free magnetic layer 17 was formed of [Co90Fe10 (0.2 nm)/Ni (0.6 nm)]×10. The capping layer 18 was formed of Ru (1 nm)/Ta (2 nm)/Ru (2 nm). Here, each of the values in parentheses represents the thickness. "Co90Fe10" indicates an alloy containing 90 at % Co and 10 at % Fe. "[Co90Fe10 (0.2 nm)/Ni (0.6 nm)]×10" indicates that 10 "Co90Fe10 (0.2 nm)/Ni (0.6 nm)" units were stacked. Magnetization curves were measured by applying a magnetic field to the sample in directions perpendicular to and parallel to the surface of the film. The results demonstrated that the direction of the easy axis of magnetization was a direction normal to the surface of the film. The saturation magnetization Ms was 773 emu/cc. The magnetic anisotropy field Ha was estimated at 5.4 kOe from the magnetization curve when the magnetic field was applied to the sample in a direction parallel to the surface of the film.

A bottom-type spin valve stacked structure described below was produced, the structure including the free magnetic layer 17. The structure included the lower electrode layer 12, the buffer layer 13, the antiferromagnetic layer 14, the pinned magnetic layer 15, the nonmagnetic spacer layer 16, the free magnetic layer 17, the capping layer 18, and the upper electrode layer 20 stacked in that order from the side of the substrate 11. The lower electrode layer 12 was formed of Ta (5 nm)/Cu (45 nm)/Ta (2 nm)/Cu (45 nm)/Ta (5 nm). The buffer layer 13 was formed of Ta (2 nm)/Ru (2 nm). The antiferromagnetic layer 14 was formed of IrMn (10 nm). The pinned magnetic layer 15 was formed of Co70Fe30 (3 nm)/Ru (0.8 nm)/Co65Fe35 (3.5 nm). The nonmagnetic spacer layer 16 was formed of MgO (1 nm). The free magnetic layer 17 was formed of [Co90Fe10 (0.2 nm)/Ni (0.6 nm)]×10. The capping layer 18 was formed of Ru (1 nm)/Ta (2 nm)/Ru (2 nm). After the deposition, heat treatment was performed in a vacuum magnetic field to pin the magnetization of the pinned magnetic layer. The conditions of the heat treatment are as follows: a degree of vacuum of $5 \times 10^{-4}$ Pa, an applied magnetic field of 10 kOe in a direction parallel to the plane of the layer, a temperature of 250° C., and a treatment time of 3 hours. A steep perpendicular magnetization reversal attributed to the free magnetic layer was observed in a magnetization curve obtained by applying a magnetic field to the heat-treated sample in a direction perpendicular to the plane of the layer. The results demonstrated that perpendicular magnetic anisotropy was maintained also in this structure. After the annealing, the element was patterned by well-known photoresist patterning and ion-beam etching to form a 90 nm×90 nm square when viewed in plan. The insulating layer 19 was formed so as to be flush with the capping layer 18. The insulating layer 19 was composed of alumina. A resist and an insulating alumina film were removed with a solvent capable of dissolving the resist. Then Ta (3 nm)/AuCu (200 nm) serving as the upper electrode layer 20 were formed by sputtering.

The saturation magnetization Ms and the magnetic anisotropy field Ha of the free magnetic layer 17 after the patterning may be determined by measurement methods described below. The saturation magnetization Ms of the free magnetic layer 17 may be determined from, for example, the resonance frequency and the resonance line width obtained from a ferromagnetic resonance profile of the free magnetic layer 17. The magnetic anisotropy field Ha of the free magnetic layer 17 may be determined by, for example, the measurement of a micro-Kerr effect. In this case, it is essential to reduce a spot diameter and perform the alignment of an optical system.

Next, a threshold current density for spin-torque oscillation of the spin valve stacked structure was determined. An oscillation spectrum was measured at different currents passing from the free magnetic layer to the pinned magnetic layer while a magnetic field of about 450 Oe was applied to the pinned magnetic layer 15 and the free magnetic layer 17 in a direction parallel to the easy axis of magnetization of the free magnetic layer 17. A current when oscillation occurred was measured. The results demonstrated that the oscillation threshold current density was $3.1 \times 10^6$ A/cm$^2$.

Example 2

A sample having the same structure as in Example 1 was produced as in Example 1, except that the free magnetic layer 17 was formed of [Co90Fe10 (0.2 nm)/Ni (0.4 nm)]×10. The saturation magnetization Ms of the free magnetic layer was 890 emu/cc. The magnetic anisotropy field Ha was estimated at 2.7 kOe. The oscillation threshold current density was $1.7 \times 10^6$ A/cm$^2$.

Example 3

A sample having the same structure as in Example 1 was produced as in Example 1, except that the free magnetic layer 17 was formed of [Co90Fe10 (0.2 nm)/Ni (1.0 nm)]×10. The saturation magnetization Ms of the free magnetic layer was 710 emu/cc. The magnetic anisotropy field Ha was estimated at 3.0 kOe. The oscillation threshold current density was $2.3 \times 10^6$ A/cm$^2$.

Example 4

A sample having the same structure as in Example 1 was produced as in Example 1, except that the free magnetic layer 17 was formed of [Co90Fe10 (0.2 nm)/Ni (0.6 nm)]×5. The saturation magnetization Ms of the free magnetic layer was 750 emu/cc. The magnetic anisotropy field Ha was estimated at 1.0 kOe. The oscillation threshold current density was $0.4 \times 10^6$ A/cm$^2$.

Example 5

A sample having the same structure as in Example 1 was produced as in Example 1, except that the free magnetic layer 17 was formed of [Co90Fe10 (0.2 nm)/Ni (0.6 nm)]×20. The saturation magnetization Ms of the free magnetic layer was 780 emu/cc. The magnetic anisotropy field Ha was estimated at 8.0 kOe. The oscillation threshold current density was $4.0 \times 10^6$ A/cm$^2$.

Example 6

A sample having the same structure as in Example 1 was produced as in Example 1, except that the free magnetic layer 17 was formed of Co30Fe70 (0.4nm)/[Co90Fe10 (0.2 nm)/Ni (0.6 nm)]×10. The saturation magnetization Ms of the free magnetic layer was 827 emu/cc. The magnetic anisotropy field Ha was estimated at 4.5 kOe. The oscillation threshold current density was $2.7 \times 10^6$ A/cm$^2$.

Example 7

A sample having the same structure as in Example 1 was produced as in Example 1, except that the free magnetic layer 17 was formed of Co30Fe70 (0.8 nm)/[Co90Fe10 (0.2 nm)/Ni (0.6 nm)]×10. The saturation magnetization Ms of the free magnetic layer was 858 emu/cc. The magnetic anisotropy field Ha was estimated at 3.3 kOe. The oscillation threshold current density was $2.1 \times 10^6$ A/cm$^2$.

Example 8

A sample having the same structure as in Example 1 was produced as in Example 1, except that the free magnetic layer 17 was formed of Co30Fe70 (0.4 nm)/Co59Fe21B20 (0.4 nm)/[Co90Fe10 (0.2 nm)/Ni (0.6 nm)]×10. The saturation magnetization Ms of the free magnetic layer was 827 emu/cc. The magnetic anisotropy field Ha was estimated at 3.0 kOe. The oscillation threshold current density was $1.8 \times 10^6$ A/cm$^2$.

Example 9

A sample having the same structure as in Example 1 was produced as in Example 1, except that the free magnetic layer 17 was formed of Co90Fe10 (0.4 nm)/[Co90Fe10 (0.2 nm)/Ni (0.6 nm)]×10. The saturation magnetization Ms of the free magnetic layer was 860 emu/cc. The magnetic anisotropy field Ha was estimated at 4.5 kOe. The oscillation threshold current density was $2.6 \times 10^6$ A/cm$^2$.

Example 10

A sample having the same structure as in Example 1. was produced as in Example 1, except that the free magnetic layer 17 was formed of [Co (0.2 nm)/Ni95Fe5 (0.6 nm)]×10. The saturation magnetization Ms of the free magnetic layer was 750 emu/cc. The magnetic anisotropy field Ha was estimated at 4.7 kOe. The oscillation threshold current density was $2.8 \times 10^6$ A/cm$^2$.

Example 11

A sample having the same structure as in Example 1 was produced as in Example 1, except that the free magnetic layer 17 was formed of [Co90Fe10 (0.2 nm)/Ni95Fe5 (0.6 nm)]×10. The saturation magnetization Ms of the free magnetic layer was 780 emu/cc. The magnetic anisotropy field Ha was estimated at 2.8 kOe. The oscillation threshold current density was $1.9 \times 10^6$ A/cm$^2$.

Example 12

A sample having the same structure as in Example 1 was produced as in Example 1, except that the free magnetic layer 17 was formed of Co20Fe60B20 (1.0 nm). The saturation magnetization Ms of the free magnetic layer was 1194 emu/cc. The magnetic anisotropy field Ha was estimated at 4.0 kOe. The oscillation threshold current density was $3.3 \times 10^6$ A/cm$^2$.

Example 13

A sample having the same structure as in Example 1 was produced as in Example 1, except that the free magnetic layer 17 was formed of [Co (0.2 nm)/Ni (0.6 nm)]×10. The saturation magnetization Ms of the free magnetic layer was 745 emu/cc. The magnetic anisotropy field Ha was estimated at 7.1 kOe. The oscillation threshold current density was $3.6 \times 10^6$ A/cm$^2$.

Example 14

A sample having the same structure as in Example 1 was produced as in Example 1, except that the free magnetic layer 17 was formed of [Co30Fe70 (0.2 nm)/Pd (0.6 nm)]×5. The saturation magnetization Ms of the free magnetic layer was 586 emu/cc. The magnetic anisotropy field Ha was estimated at 7.4 kOe. The oscillation threshold current density was $6.5 \times 10^6$ A/cm$^2$.

Example 15

A sample having the same structure as in Example 1 was produced as in Example 1, except that the free magnetic layer 17 was formed of [Co90Fe10 (0.2 nm)/Pd (0.6 nm)]×5. The saturation magnetization Ms of the free magnetic layer was 550 emu/cc. The magnetic anisotropy field Ha was estimated at 15.4 kOe. The oscillation threshold current density was $10.8 \times 10^6$ A/cm$^2$.

Comparative Example 1

A sample having the same structure as in Example 1 was produced as in Example 1, except that the free magnetic layer 17 was formed of Co30Fe70 (0.4 nm)/Co59Fe21B20 (1.2 nm)/[Co90Fe10 (0.2 nm)/Ni (0.6 nm)]×10. The saturation magnetization Ms of the free magnetic layer was 824 emu/cc. The magnetic anisotropy field Ha was estimated at −4.7 kOe. Here, when Ha is a negative value, the easy axis of magnetization lies in the in-plane direction of the layer. The oscillation threshold current density was $67.0 \times 10^6$ A/cm$^2$.

Table 1 summarizes the results of the examples and the comparative example.

The normalized current density indicates a value normalized to an oscillation threshold current density when x=0.

TABLE 1

| | Structure of free magnetic layer | Ms (emu/cc) | Ha (Oe) | Ha/Ms | Oscillation threshold current density ($\times 10^6$ A/cm$^2$) |
|---|---|---|---|---|---|
| Example 1 | [Co90Fe10 (0.2 nm)/Ni (0.6 nm)] × 10 | 773 | 5400 | 6.986 | 3.1 |
| Example 2 | [Co90Fe10 (0.2 nm)/Ni (0.4 nm)] × 10 | 890 | 2700 | 3.034 | 1.7 |
| Example 3 | [Co90Fe10 (0.2 nm)/Ni (1.0 nm)] × 10 | 710 | 3000 | 4.225 | 2.3 |
| Example 4 | [Co90Fe10 (0.2 nm)/Ni (0.6 nm)] × 5 | 750 | 1000 | 1.333 | 0.4 |
| Example 5 | [Co90Fe10 (0.2 nm)/Ni (0.6 nm)] × 20 | 780 | 8000 | 10.256 | 4.0 |
| Example 6 | Co30Fe70 (0.4 nm)/[Co90Fe10 (0.2 nm)/Ni (0.6 nm)] × 10 | 827 | 4500 | 5.441 | 2.7 |
| Example 7 | Co30Fe70 (0.8 nm)/[Co90Fe10 (0.2 nm)/Ni (0.6 nm)] × 10 | 858 | 3300 | 3.846 | 2.1 |
| Example 8 | Co30Fe70 (0.4 nm)/Co59Fe21B20 (0.4 nm)/[Co90Fe10 (0.2 nm)/Ni (0.6 nm)] × 10 | 827 | 3000 | 3.628 | 1.8 |
| Example 9 | Co90Fe10 (0.4 nm)/[Co90Fe10 (0.2 nm)/Ni (0.6 nm)] × 10 | 860 | 4500 | 5.233 | 2.6 |
| Example 10 | [Co (0.2 nm)/Ni95Fe5 (0.6 nm)] × 10 | 750 | 4700 | 6.267 | 2.8 |
| Example 11 | [Co90Fe10 (0.2 nm)/Ni95Fe5 (0.6 nm)] × 10 | 780 | 2800 | 3.590 | 1.9 |
| Example 12 | Co20Fe60B20 (1.0 nm) | 1194 | 4000 | 3.351 | 3.3 |
| Example 13 | [Co (0.2 nm)/Ni (0.6 nm)] × 10 | 745 | 7100 | 9.530 | 3.6 |
| Example 14 | [Co30Fe70 (0.2 nm)/Pd (0.6 nm)] × 5 | 586 | 7400 | 12.628 | 6.5 |
| Example 15 | [Co90Fe10 (0.2 nm)/Pd (0.6 nm)] × 5 | 550 | 15400 | 28.000 | 10.8 |
| Comparative Example 1 | Co30Fe70 (0.4 nm)/Co59Fe21B20 (1.2 nm)/[Co90Fe10 (0.2 nm)/Ni (0.6 nm)] × 10 | 824 | −4700 | −5.704 | 67.0 |

Table 1 demonstrates that in any example, the oscillation threshold current density is lower than that in the comparative example. In particular, when 1.257 Ms<Ha<12.57 Ms is satisfied, the oscillation threshold current density is low.

Figure 3:
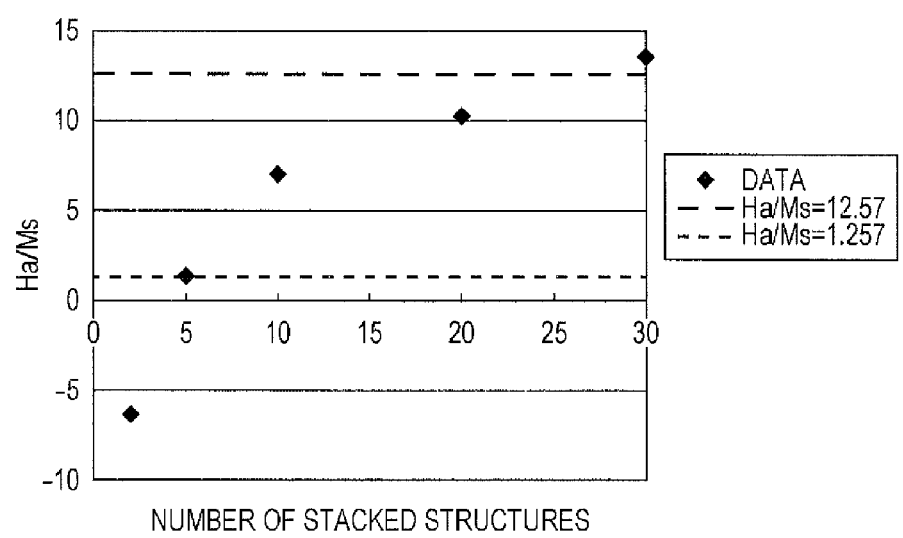
FIG. 3 is a graph illustrating the relationship between x and Ha/Ms when a free magnetic layer is composed of [Co90Fe10 (0.2 nm)/Ni (0.6 nm)]×x, according to the first embodiment of the present invention.

The relationship between x (the number of the stacked structures) and Ha/Ms when the free magnetic layer 17 was formed of [Co90Fe10 (0.2 nm)/Ni (0.6 nm)]×x in Example 1 is summarized in FIG. 3. Here, when Ha/Ms is a positive value, the easy axis of magnetization lies in a direction normal to the plane of the layer. When Ha/Ms is a negative value, the easy axis of magnetization lies in the in-plane direction of the layer. This figure demonstrates that the number of the stacked structures when 1.257 Ms<Ha<12.57 Ms is satisfied is 5 or more and 27 or less.

Figure 4:
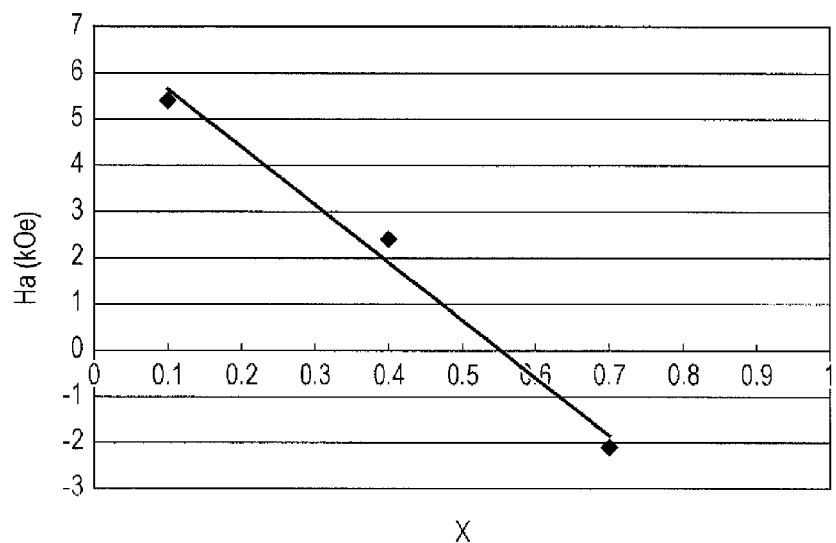
FIG. 4 is a graph illustrating the relationship between x and Ha when a free magnetic layer is composed of [$Co_{1-x}Fe_x$ (0.2 nm)/Ni (0.6 nm)]×10, according to the first embodiment of the present invention.
Figure 5:
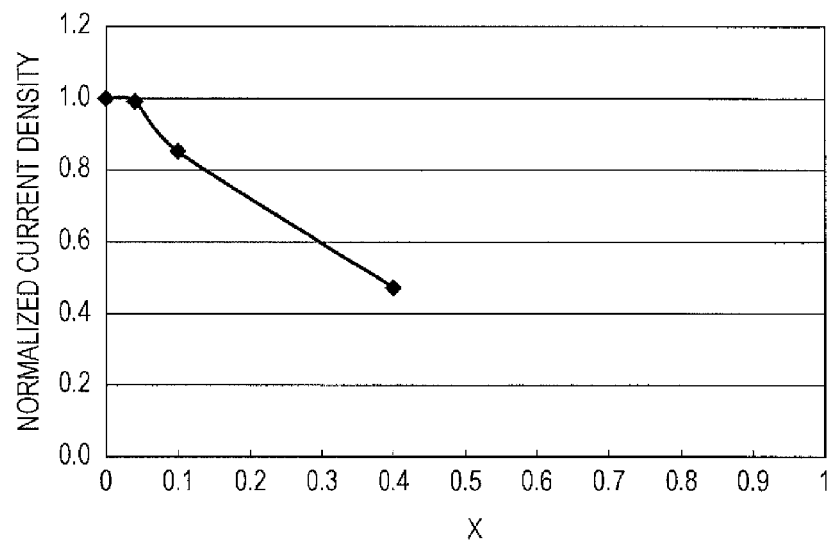
FIG. 5 is a graph illustrating the relationship between x and the normalized current density when a free magnetic layer is composed of [$Co_{1-x}Fe_x$ (0.2 nm)/Ni (0.6 nm)]×10, according to the first embodiment of the present invention.

The relationship between x and Ha when the free magnetic layer 17 was formed of [Co$_{1-x}$Fe$_x$ (0.2 nm)/Ni (0.6 nm)]×10 in Example 1 is summarized in FIG. 4. Here, when Ha is a positive value, the easy axis of magnetization lies in a direction normal to the plane of the layer. When Ha is a negative value, the easy axis of magnetization lies in the in-plane direction of the layer. This figure demonstrates that in order that the free magnetic layer 17 may exhibit perpendicular magnetic anisotropy, CoFe is required to have an Fe content of 55 at % or less. As is clear from the relationship between x and the normalized current density illustrated in FIG. 5, an Fe content of CoFe of 4 at % or more provides the effect of reducing the oscillation threshold current density. Note that the normalized current density indicates a value normalized to an oscillation threshold current density when x=0.

Figure 6:
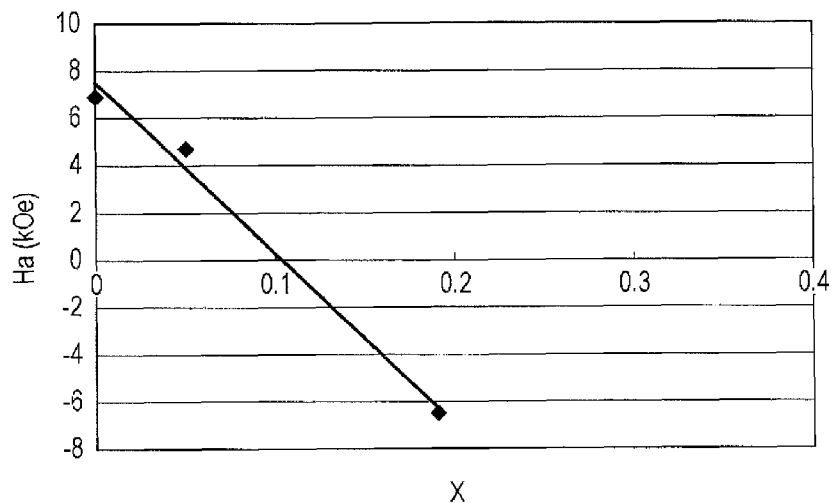
FIG. 6 is a graph illustrating the relationship between x and Ha when a free magnetic layer is composed of [Co (0.2 nm)/$Ni_{1-x}Fe_x$ (0.6 nm)]×10, according to the first embodiment of the present invention.
Figure 7:
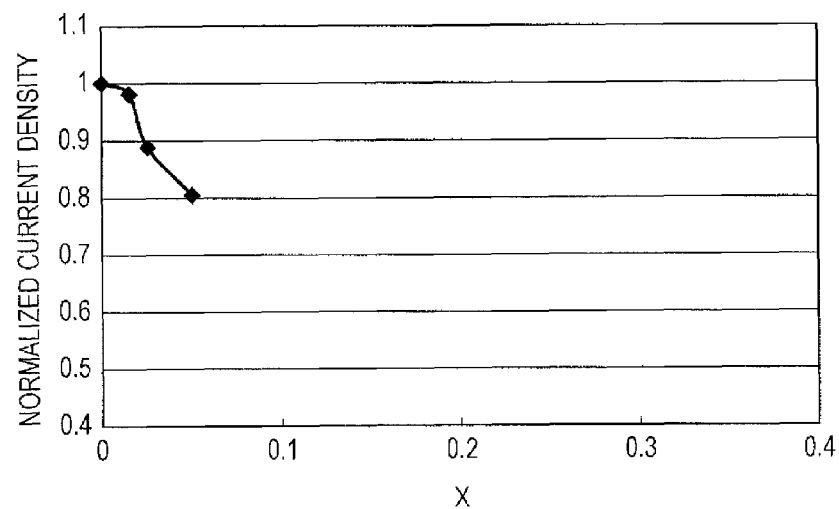
FIG. 7 is a graph illustrating the relationship between x and the normalized current density when a free magnetic layer is composed of [Co (0.2nm)/$Ni_{1-x}Fe_x$ (0.6 nm)]×10, according to the first embodiment of the present invention.

The relationship between x and Ha when the free magnetic layer 17 was formed of [Co (0.2 nm)/Ni$_{1-x}$Fe$_x$ (0.6 nm)]×10 in Example 1 is summarized in FIG. 6. Here, when Ha is a positive value, the easy axis of magnetization lies in a direction normal to the plane of the layer. When Ha is a negative value, the easy axis of magnetization lies in the in-plane direction of the layer. This figure demonstrates that in order that the free magnetic layer 17 may exhibit perpendicular magnetic anisotropy, NiFe is required to have an Fe content of 10 at % or less. As is clear from the relationship between x and the normalized current density illustrated in FIG. 7, an Fe content of NiFe of 1.5 at % or more provides the effect of reducing the oscillation threshold current density. Note that the normalized current density indicates a value normalized to an oscillation threshold current density when x=0.

Figure 8:
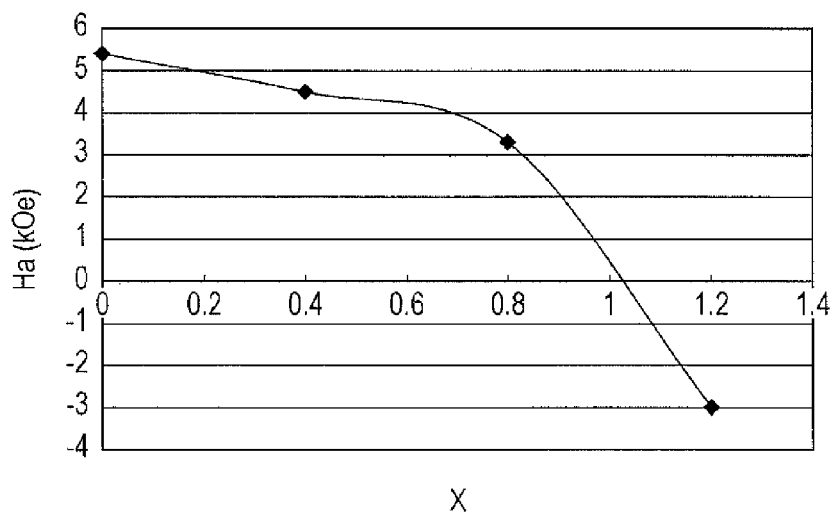
FIG. 8 is a graph illustrating the relationship between x and Ha when a free magnetic layer is composed of Co30Fe70 (x nm)/[Co90Fe10 (0.2 nm)/Ni (0.6 nm)]×10, according to the first embodiment of the present invention.
Figure 9:
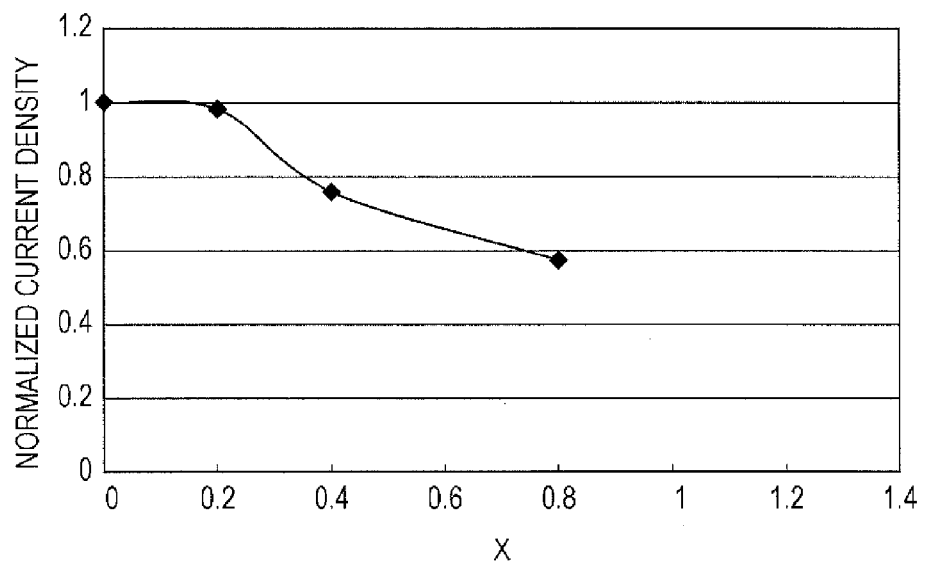
FIG. 9 is a graph illustrating the relationship between x and the normalized current density when a free magnetic layer is composed of Co30Fe70 (x nm)/[Co90Fe10 (0.2 nm)/Ni (0.6 nm)]×10, according to the first embodiment of the present invention.

The relationship between x and Ha when the free magnetic layer 17 was formed of Co30Fe70 (x nm)/[Co90Fe10 (0.2 nm)/Ni (0.6 nm)]×10 in Example 1 is summarized in FIG. 8. Here, when Ha is a positive value, the easy axis of magnetization lies in a direction normal to the plane of the layer. When Ha is a negative value, the easy axis of magnetization lies in the in-plane direction of the layer. This figure demonstrates that in order that the free magnetic layer 17 may exhibit perpendicular magnetic anisotropy, Co30Fe70 is required to have a thickness of 1.0 nm or less. As is clear from the relationship between x and the normalized current density illustrated in FIG. 9, when x=0.2 nm or more, the effect of reducing the oscillation threshold current density is provided. Note that the normalized current density indicates a value normalized to an oscillation threshold current density when x=0.

Figure 10:
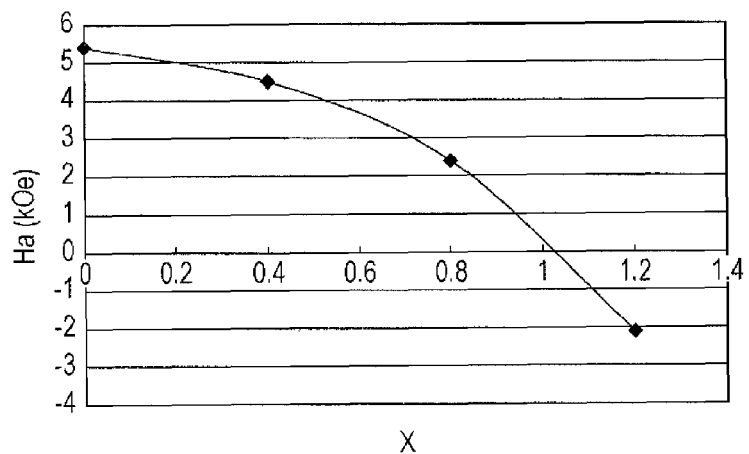
FIG. 10 is a graph illustrating the relationship between x and Ha when a free magnetic layer is composed of Co59Fe21B20 (x nm)/[Co90Fe10 (0.2 nm)/Ni (0.6 nm)]×10, according to the first embodiment of the present invention.
Figure 11:
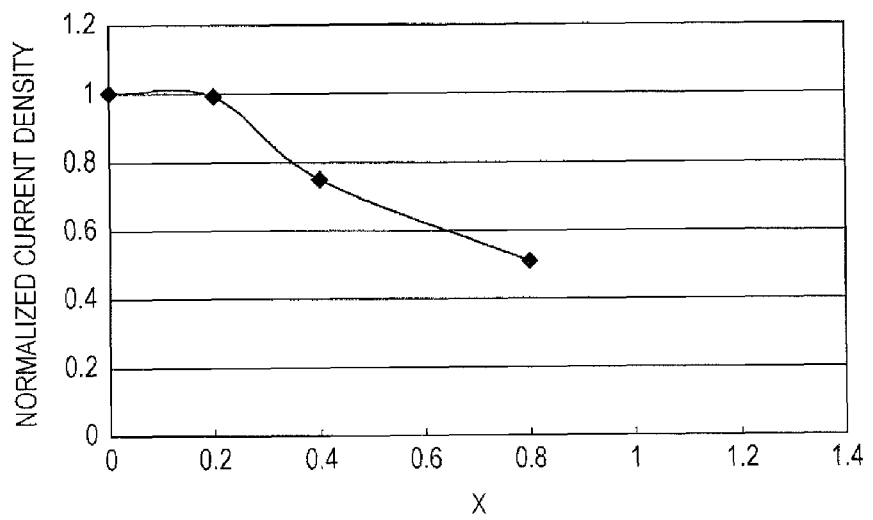
FIG. 11 is a graph illustrating the relationship between x and the normalized current density when a free magnetic layer is composed of Co59Fe21B20 (x nm)/[Co90Fe10 (0.2 nm)/Ni (0.6 nm)]×10, according to the first embodiment of the present invention.

The relationship between x and Ha when the free magnetic layer 17 was formed of Co59Fe21B20 (x nm)/[Co90Fe10 (0.2 nm)/Ni (0.6 nm)]×10 in Example 1 is summarized in FIG. 10. Here, when Ha is a positive value, the easy axis of magnetization lies in a direction normal to the plane of the layer. When Ha is a negative value, the easy axis of magnetization lies in the in-plane direction of the layer. This figure demonstrates that in order that the free magnetic layer 17 may exhibit perpendicular magnetic anisotropy, Co59Fe21B20 is required to have a thickness of 1.0 nm or less. As is clear from the relationship between x and the normalized current density illustrated in FIG. 11, when x=0.2 nm or more, the effect of reducing the oscillation threshold current density is provided. Note that the normalized current density indicates a value normalized to an oscillation threshold current density when x=0.

The results described above demonstrated the following: In the case where a magnetic oscillation element includes a pinned magnetic layer, a free magnetic layer, a nonmagnetic spacer layer provided between the pinned magnetic layer and the free magnetic layer, and a pair of electrodes, in which the easy axis of magnetization of the pinned magnetic layer lies in an in-plane direction of the layer, and in which the easy axis of magnetization of the free magnetic layer lies in a direction normal to the plane of the layer, it is possible to reduce the oscillation threshold current density. Furthermore, when the relationship between the saturation magnetization Ms and the magnetic anisotropy field Ha of the free magnetic layer satisfies 1.257 Ms<Ha<12.57 Ms, it is possible to further reduce the oscillation threshold current density.

While the present invention has been specifically described with reference to the preferred embodiments, the present invention is not limited to the embodiments or examples. Various changes may be made within the spirit and scope of the invention as claimed in claims.

For example, while the bottom-type spin valve stacked structure is used in this embodiment, a top-type spin valve structure may be used.

With respect to the industrial applicability of the present invention, the present invention is applicable to local oscillators, transceivers for wireless communication, high-frequency-assisted recording elements (MAMR), and so forth.

What is claimed is:

1. A thin-film magnetic oscillation element comprising:
   a pinned magnetic layer;
   a free magnetic layer;
   a nonmagnetic spacer layer provided between the pinned magnetic layer and the free magnetic layer; and
   a pair of electrodes,
   wherein
   an easy axis of magnetization of the pinned magnetic layer is in an in-plane direction of a plane of the pinned magnetic layer,
   an easy axis of magnetization of the free magnetic layer is in a direction normal to a plane of the free magnetic layer, and
   a relationship between a saturation magnetization Ms and a magnetic anisotropy field Ha of the free magnetic layer satisfies $1.333 Ms \leq Ha \leq 12.628 Ms$.

2. The thin-film magnetic oscillation element according to claim 1, wherein the free magnetic layer is composed of an alloy or a stacked film containing at least one element selected from Co, Ni, Fe, and B.

3. The thin-film magnetic oscillation element according to claim 1, wherein the free magnetic layer has a plurality of stacked structures each selected from CoFe/Ni, Co/NiFe, and CoFe/NiFe.

* * * * *